United States Patent [19]
Fazan et al.

[11] Patent Number: 5,130,885
[45] Date of Patent: Jul. 14, 1992

[54] DRAM CELL IN WHICH A SILICON-GERMANIUM ALLOY LAYER HAVING A ROUGH SURFACE MORPHOLOGY IS UTILIZED FOR A CAPACITIVE SURFACE

[75] Inventors: Pierre Fazan; Gurtej S. Sandhu, both of Boise, Id.

[73] Assignee: Micron Technology, Inc., Boise, Id.

[21] Appl. No.: 727,701

[22] Filed: Jul. 10, 1991

[51] Int. Cl.[5] .................... H01G 4/10; H01L 21/70
[52] U.S. Cl. ...................................... 361/313; 437/60
[58] Field of Search ................... 361/311, 312, 313; 357/51, 54; 29/25, 42; 437/60

[56] References Cited

U.S. PATENT DOCUMENTS

| | | | |
|---|---|---|---|
| 4,882,649 | 11/1989 | Chen et al. | 361/313 |
| 4,931,897 | 6/1990 | Tsukamoto et al. | 361/313 |
| 5,036,020 | 7/1991 | Tigelaar | 437/60 |

OTHER PUBLICATIONS

"Capacitance-Enhanced Stacked-Capacitor with Engraved Storage Electrode for Deep Submicron Drams", T. Mine et al., 1989, pp. 137-140.
"Optimization Of Process Conditions For Selective Deposition Of Polycrystalline $Si_xGe_{1-x}$ Alloys In A Rapid Thermal Process", M. Sanganeria et al., Abstract No. 350.

*Primary Examiner*—Donald A. Griffin
*Attorney, Agent, or Firm*—Angus C. Fox, III

[57] ABSTRACT

A dynamic random access memory cell in which a silicon-germanium alloy layer having a rough surface morphology is utilized for the capacitive surface of the storage-node plate of the cell capacitor. To create a DRAM array having such cells, a silicon-germanium alloy is deposited, typically via rapid thermal chemical vapor deposition, on top of a single crystalline silicon or polycrystalline silicon storage-node plate layer under conditions which favor three-dimensional growth in the form of macroscopic islanding (i.e., a high concentration of germanium in precursor gases and relatively high deposition temperature). A cell dielectric layer, which exhibits the property of bulk-limited conduction (e.g., silicon nitride), is utilized. Except for the deposition of the silicon-germanium alloy, array processing is conventional.

24 Claims, 4 Drawing Sheets

5,130,885

DRAM CELL IN WHICH A SILICON-GERMANIUM ALLOY LAYER HAVING A ROUGH SURFACE MORPHOLOGY IS UTILIZED FOR A CAPACITIVE SURFACE

FIELD OF THE INVENTION

This invention relates to semiconductor technology and, more specifically, to the design of capacitors used in dynamic random access memory (DRAM) cells. The focus of the invention is the use of a silicon-germanium alloy layer having a rough surface morphology as a charge storage surface within the capacitor of a DRAM cell.

BACKGROUND OF THE INVENTION

The memory cells of dynamic random access memories are comprised of two main components: a field-effect transistor and a capacitor. In DRAM cells utilizing a conventional planar capacitor, far more chip surface area is dedicated to the planar capacitor than to the field-effect transistor (FET). Wordlines are generally etched from a polysilicon-1 layer. A doped region of silicon substrate functions as the lower (storage-node) capacitor plate, while a doped polysilicon-2 layer generally functions as the upper capacitor plate (cell plate). Although planar capacitors have generally proven adequate for use in DRAM chips up to the one-megabit level, they are considered to be unusable for more advanced DRAM generations. As component density in memory chips has increased, the shrinkage of cell capacitor size has resulted in a number of problems. Firstly, the alpha-particle component of normal background radiation can generate hole-electron pairs in the silicon substrate, which functions as the lower capacitor plate. This phenomena will cause a charge stored within the affected cell capacitor to rapidly dissipate, resulting in a "soft" error. Secondly, the sense-amp differential signal is reduced. This aggravates noise sensitivity and makes it more difficult to design a sense-amp having appropriate signal selectivity. Thirdly, as cell capacitor size is decreased, the cell refresh time must generally be shortened, thus requiring more frequent interruptions for refresh overhead. The difficult goal of a DRAM designer is therefore to increase or, at least, maintain cell capacitance as cell size shrinks, without resorting to processes that reduce product yield or that markedly increase the number of masking and deposition steps in the production process.

As a result of the problems associated with the use of planar capacitors for high-density DRAM memories, all manufacturers of 4-megabit DRAMs are utilizing cell designs based on non-planar capacitors. Two basic non-planar capacitor designs are currently in use: the trench capacitor, and the stacked capacitor. Both types of non-planar capacitors typically require a considerably greater number of masking, deposition and etching steps for their manufacture than does a planar capacitor.

In a trench capacitor, charge is stored primarily vertically, as opposed to horizontally in a planar capacitor. Since trench capacitors are fabricated in trenches which are etched in the substrate, the typical trench capacitor, like the planar capacitor, is subject to soft errors. In addition, there are several other problems inherent in the trench design. One problem is that of trench-to-trench charge leakage, caused by the parasitic transistor effect between adjacent trenches. Another problem is the difficulty of completely cleaning the trenches during the fabrication process; failure to completely clean a trench will generally result in a defective cell.

The stacked capacitor design, on the other hand, has proven somewhat more reliable and easier to fabricate than the trench design. Since both the lower and the upper plates of a typical stacked capacitor are formed from individual polysilicon layers, the stacked capacitor is generally much less susceptible to soft errors than either the planar or trench capacitors. By placing both the wordline and the digitline beneath the capacitive layers, and having the lower layer make contact with the substrate by means of a buried contact, some manufacturers have created stacked capacitor designs in which vertical portions of the capacitor contribute significantly to the total charge storing capacity. Since a stacked capacitor generally covers not only the entire area of a cell (including the cell's access FET), but adjacent field oxide regions as well, capacitance is considerably enhanced over that available from a planar type cell.

Although the stacked cell capacitor has proven to be the most manufacturable design for the four-megabit generation, trenches are generally considered to be a good bet for future generations, due to the fact that trenches can be made deeper for increased capacitance, without affecting topography of the array.

However, the continuing development of new technology makes it impossible to reliably predict the design of future DRAM generations. For example, the problem of high soft error rate characteristic of early trench designs has been solved by lining the trenches with a dielectric material prior to storage-node plate layer deposition. Furthermore, advances in stacked capacitor technology promise to make that design a participant in the 64-megabit generation. For example, complex three-dimensional structures have been created that greatly increase storage-node plate surface area. Generally, however, such structures require complex processing and multiple photomasks.

Another promising technique for increasing capacitance in DRAM cells is the use of rough polysilicon for the storage-node plate. U.S. Pat. No. (still unknown) issued to Pierre Fazan and Ruojia Lee on Aug. 27, 1991 describes a DRAM cell having a polysilicon storage-node capacitor plate which has been subjected to oxidation in order to increase the surface area thereof. Such storage-node plates are used in combination with a dielectric material such as silicon nitride, which has bulk-limited conduction characteristics, to avoid plate-to-plate current leakage. The use of such a design has resulted in cell capacitance increases of up to 35 percent. In a paper delivered to the 21st Conference on Solid State Devices and Materials in Tokyo, Japan, T. Mine, et al, describe a process for doubling the capacitance of a DRAM cell. The process involves performing an etch on a polysilicon storage-node plate layer following the deposition of a spin-on-glass layer in which are embedded photoresist particles.

Within the last several years, it has been suggested that the use of epitaxial silicon-germanium alloys might improve performance of existing semiconductor devices and possibly lead to new device structures through band gap engineering. The Department of Electrical and Computer Engineering at North Carolina State University has been active in basic research related to the use of these alloys as semiconductor materials. In Abstract No. 350 published by the 179th Electrochemical Society Meeting in Washington, D.C. in May 1991, M. Sanganeria and four colleagues report that using a rapid thermal chemical vapor deposition (RTCVD) process, selective deposition of polycrystalline $Si_xGe_{1-x}$ is dependent on the amount of germanium in the gas stream. However, as more germanium is added to the gas stream, the concentration of germanium in the deposited alloy, and thus the lattice mismatch between the alloy and the substrate increases, which favors a three dimensional growth. The lattice mismatch results in a rough surface morphology. Such three dimensional growth was shown to be dominant when the interfacial energy between the alloy and the substrate is greater than the sum of the alloy/ambient and substrate/ambient surface energies. At higher deposition temperatures, macroscopic islanding of the deposited alloy crystals was observed. This phenomenon has been attributed to a temperature-dependant increase in surface mobility of the depositing species. The North Carolina State University group show that deposition conditions must be optimized in order to deposit smooth polycrystalline $Si_xGe_{1-x}$.

SUMMARY OF THE INVENTION

This invention provides an effective method for increasing the capacitance of a DRAM cell through the use of silicon-germanium alloys as the capacitive surface of the storage-node capacitor plate. To create a DRAM array having such cells, a silicon-germanium alloy is deposited, typically via rapid thermal chemical vapor deposition, on top of the storage-node plate layer under conditions which favor three-dimensional growth (i.e., a high concentration of germanium in precursor gases and relatively high deposition temperature). Following the patterning of the alloy-covered layer, a cell dielectric layer is blanket deposited on top of the array. In order to minimize plate-to-plate leakage within cell capacitors, a dielectric material which exhibits the property of bulk-limited conduction is required. Silicon nitride and tantalum pentoxide are such materials. The array is completed in a conventional manner by depositing a cell plate layer, then patterning the cell plate layer and the cell dielectric layer in a single etch step. For a planar array, the silicon germanium alloy may be selectively deposited on the substrate which will function as the storage node plate. Conventional processing is then used to complete the array.

PREFERRED EMBODIMENT OF THE INVENTION

The fabrication of a dynamic random access memory (DRAM) array of stacked cell design will be described with reference to FIGS. 1 to 4. A silicon-germanium alloy coated polysilicon layer is utilized for the capacitive surface of the storage-node capacitor plate of each memory cell within the array. In order to increase plate surface area and, hence, individual cell capacitance, the alloy coating is deposited under conditions that favor macroscopic islanding of the depositing alloy crystals.

Figure 1:
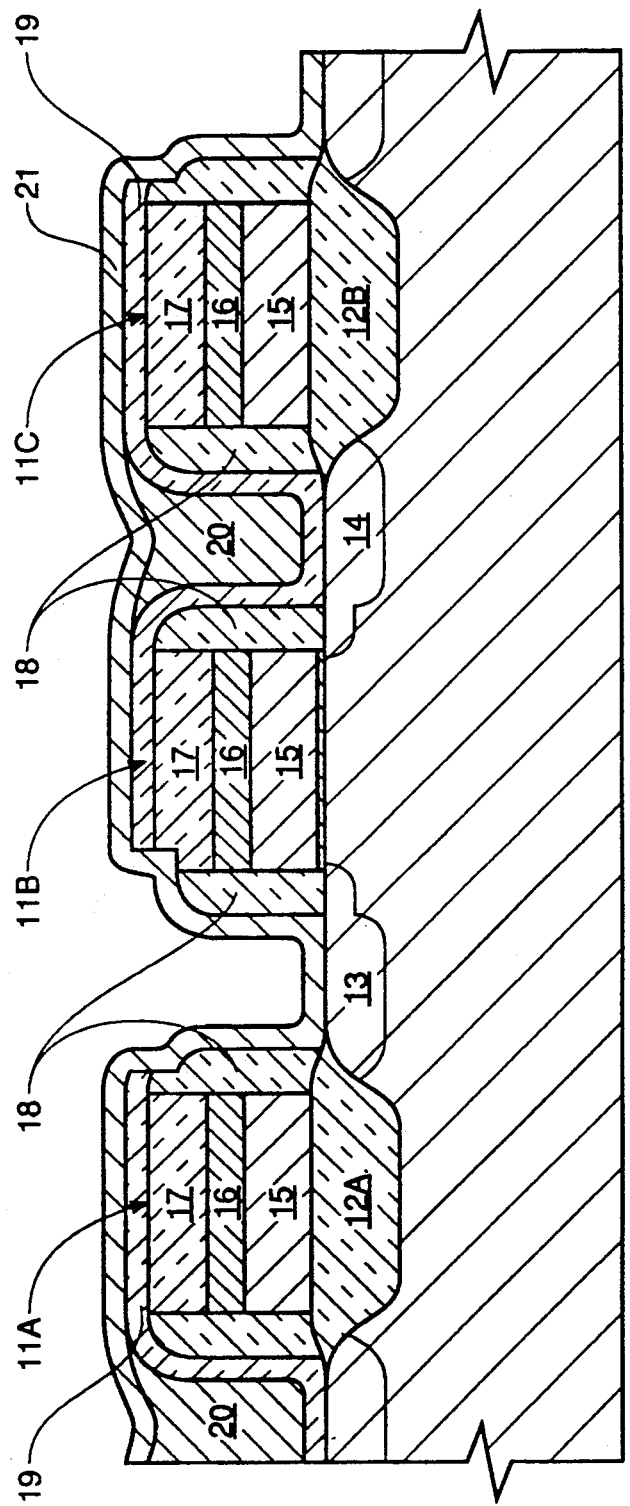
FIG. 1 is a cross-sectional view of an in-process DRAM array at the stage where a polycrystalline silicon storage-node plate layer has been conformally deposited over the surface of the array.

Referring now to FIG. 1, a small portion of an in-process dynamic random access memory (DRAM) array of stacked capacitor design is depicted at the cell capacitor fabrication stage. Three wordlines 11A, 11B, and 11C are depicted in this cross-sectional view. In the portion of the array that is depicted, wordlines 11A and 11C are traversing field oxide regions 12A and 12B respectively. Wordline 11B, on the other hand, is traversing an active area, thus forming an access transistor in combination with storage-node junction 13 and access-node junction 14. Each wordline 11 consists of a conductively-doped polysilicon layer 15, a refractory metal silicide layer 16, which lowers the sheet resistance of polysilicon layer 15. Each wordline 11 is covered on its upper surface by a dielectric capping layer 17, and on its sides by dielectric spacers 18. Also visible in this view is a silicon dioxide substrate isolation layer 19 and a silicon nitride planarization layer 20 which is employed to reduce bitline resistance by bridging interwordline gaps. A bitline, which is not visible in this cross-sectional view, since it runs perpendicular to the wordlines, will make contact to access-node junction 14. The storage-node plate of the cell capacitor will make contact with the storage-node junction 13. The storage-node plates for all cells within the array are constructed by depositing a conformal polysilicon layer 21 over the surface of the array. It should be noted that those portions of the planarization layer 20 and the substrate isolation layer 18 which were superjacent the storage-node junction 13 had been removed by a storage-node contact etch prior to the deposition of conformal poly layer 21.

Figure 2:
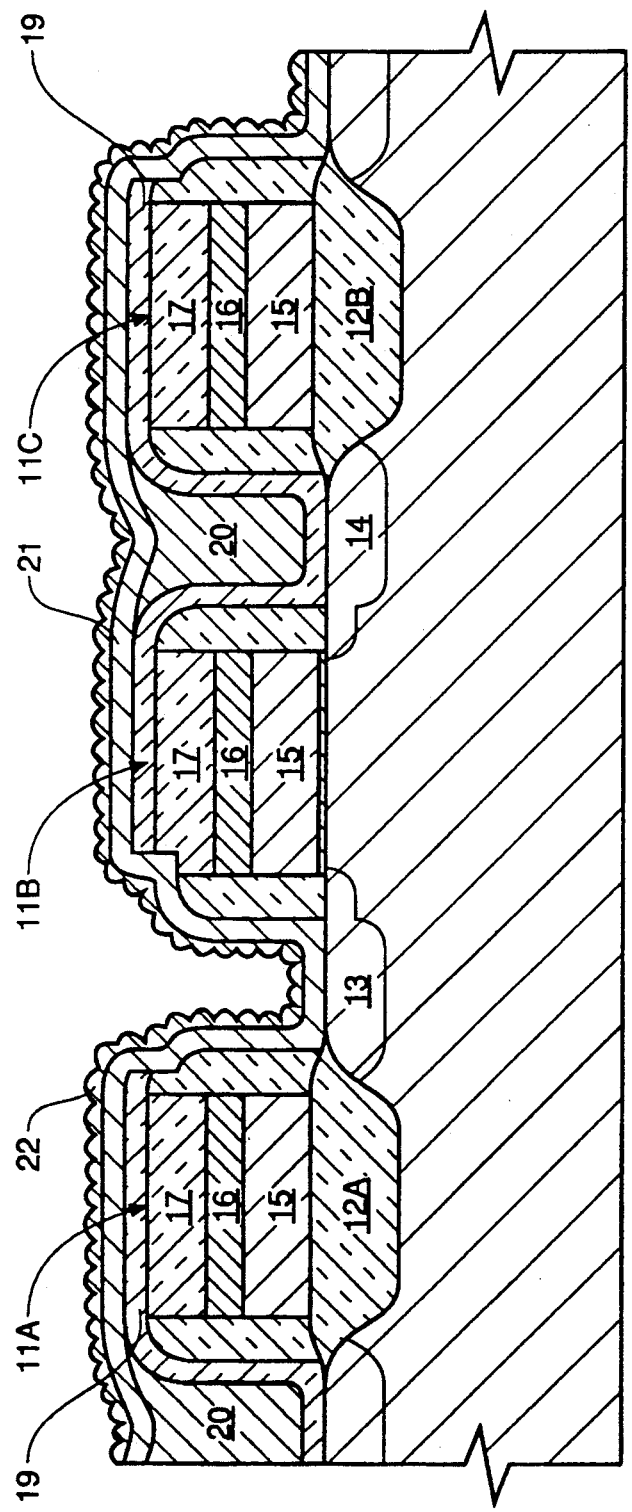
FIG. 2 is a cross-sectional view of the in-process DRAM array of FIG. 1 following deposition of a silicon-germanium alloy layer on top of the storage-node plate layer.

Referring now to FIG. 2, a polycrystalline silicon-germanium alloy ($Si_xGe_{1-x}$) coating 22 has been deposited on top of conformal poly layer 21 via rapid thermal chemical vapor deposition, using $SiH_2Cl_2$ and $GeH_4$ as precursor gases and $H_2$ as a carrier gas. The alloy layer 22 is deposited via Rapid Thermal Chemical Vapor Deposition (RTCVD) under conditions that favor macroscopic islanding of the depositing alloy crystals. In order to maximize the potential capacitance gain, deposition conditions are adjusted such that average island diameter is at least four times the thickness of the capacitor dielectric layer that will be created in a subsequent step. When average diameter is less than four times the thickness of the dielectric layer, the dielectric layer bridges the gaps between islands, creating a relatively smooth surface on which the cell plate capacitive layer is subsequently deposited, and thus nullifying the effect of the rough surface of the storage-node plate. In the case where a silicon dioxide-silicon nitride-silicon dioxide sandwich is used for the capacitor dielectric layer, the islands should be at least 200Å, and as much as 2000Å in diameter, since the total thickness of the dielectric layer will be at least 50–60Å. Deposition conditions that favor the creation of macroscopic islands having an average diameter of approximately 2000Å are a deposition temperature of 750°–800° C., a GeH$_4$:SiH$_2$Cl$_2$ flow ratio of 0.5–1.0, and a total reactor pressure of 2.5 torr.

Figure 3:
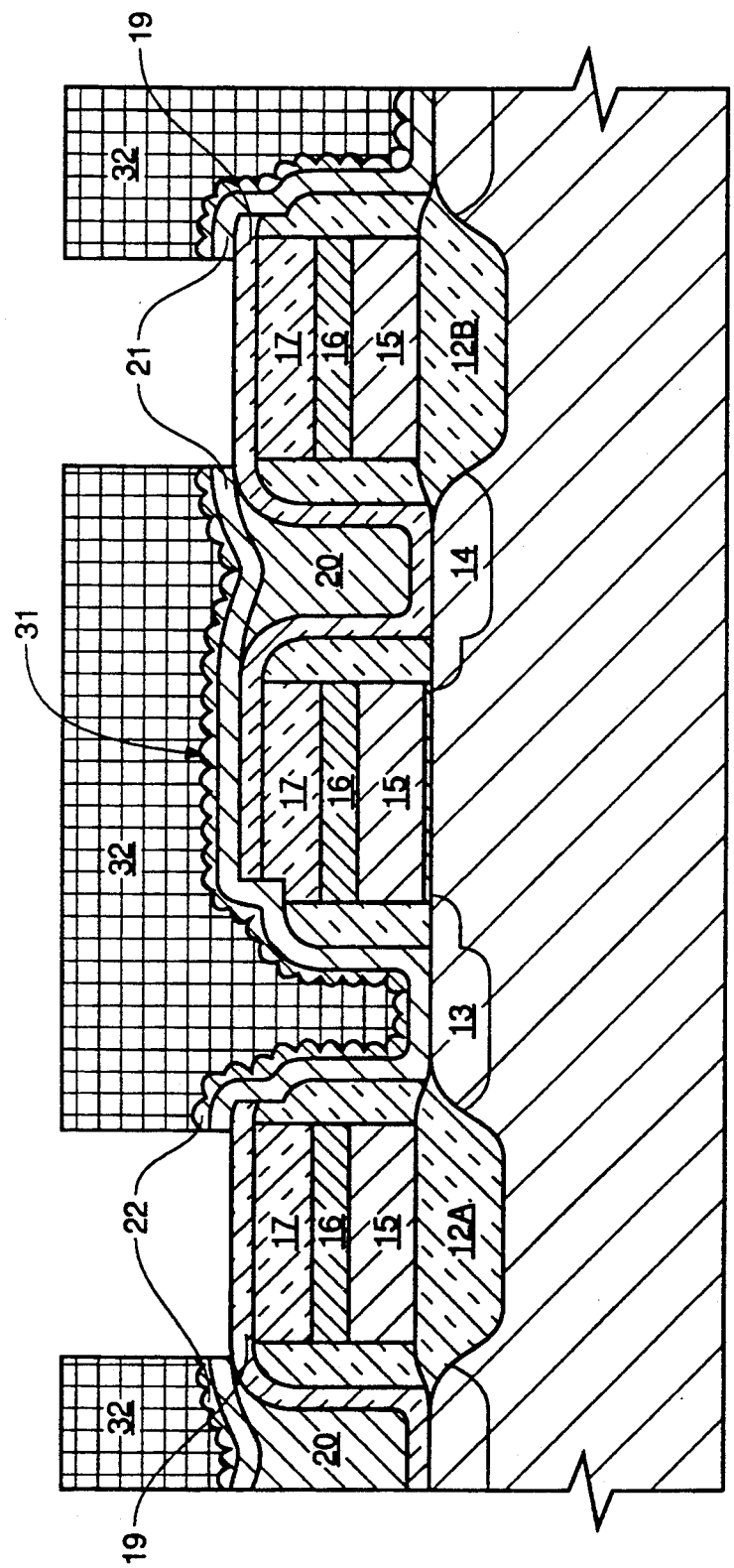
FIG. 3 is a cross-sectional view of the in-process DRAM array of FIG. 2 following patterning of the alloy covered storage-node plate layer with a first photoresist mask and etching of the alloy-covered storage-node plate layer in order to create individual storage node plates for each cell within the array.

Referring now to FIG. 3, the storage-node plate layer 31, which consists of polysilicon layer 21 and alloy coating 22, is patterned with a first photomask 32, then etched to create individual storage-node plates for each memory cell within the array.

Figure 4:
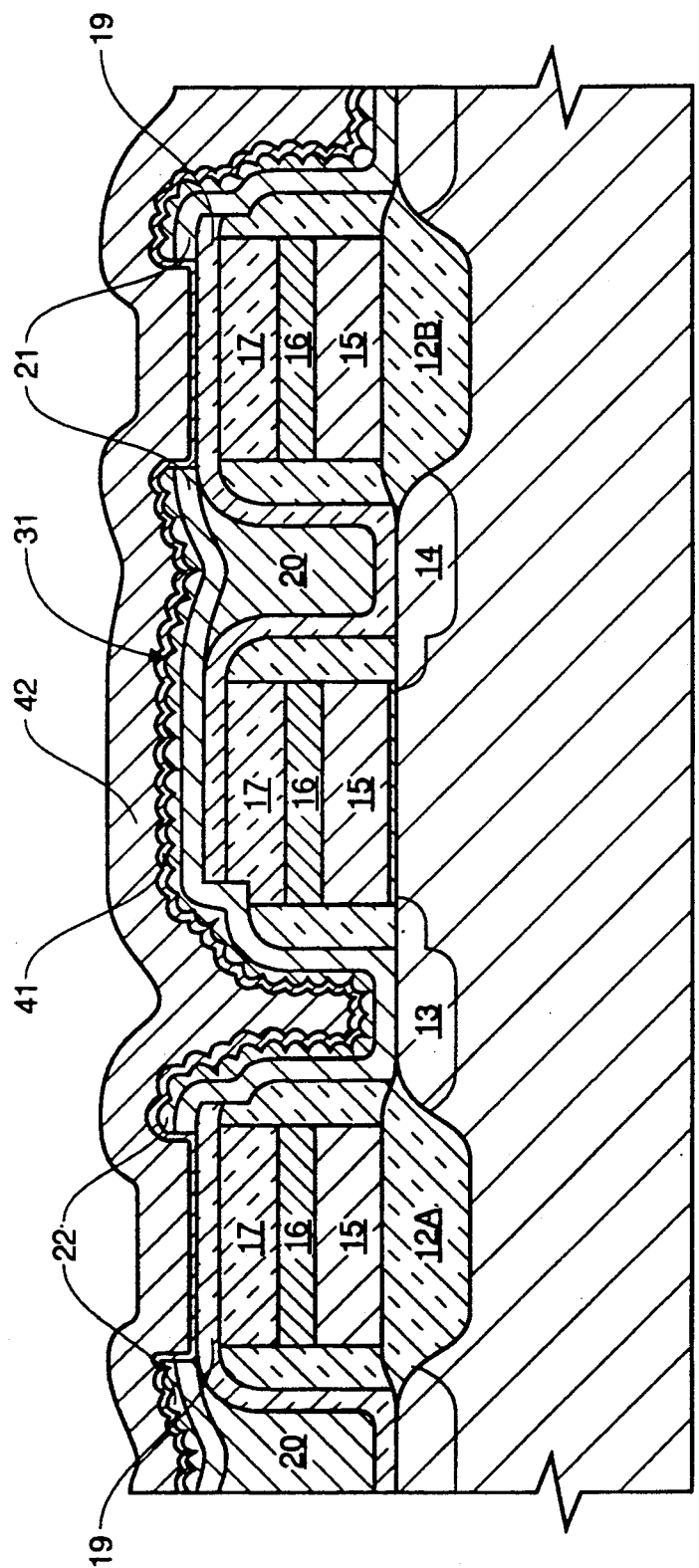
FIG. 4 is a cross-sectional view of the in-process DRAM array of FIG. 3 following the blanket, conformal deposition of a dielectric layer having bulk-limited conduction characteristics over the surface of the array, and the blanket, conformal deposition of a polycrystalline silicon cell plate layer on top of the dielectric layer.

Referring now to FIG. 4, a silicon nitride capacitor dielectric layer 41 is blanket deposited over the surface of the array. The islands, or bumps, on the surface of storage node plate layer 31 create regions of increased electric field strength. If a silicon dioxide capacitor dielectric were utilized, the increased electric field strength would tend to both lower the breakdown voltage of the cell capacitors and increase plate-to-plate current leakage by several orders of magnitude. A silicon dioxide dielectric layer would function as a tunneling layer. Because conduction in silicon dioxide is electrode limited (generally considered to be in accordance with what is known as the Fowler-Nordheim mechanism) the use of thin layers of silicon dioxide as the sole dielectric material for a DRAM cell capacitor having plates with roughened surfaces is precluded. However, because conduction in silicon nitride and tantalum pentoxide is bulk limited, most likely in accordance with what is known as the Frankel-Poole mechanism, these two materials are much more suitable as capacitor dielectric materials in DRAMs where capacitive layers are not smooth. Because it is generally considered possible to create a thinner capacitor dielectric layer with silicon nitride than with tantalum pentoxide, silicon nitride is utilized in this application to minimize the bridging effect that inevitably occurs as the dielectric layer is deposited on the storage-node layer 31. Following the deposition of silicon nitride layer 41, the array is subjected to a thermal oxidation step, which creates silicon dioxide plugs in any imperfections within silicon nitride layer 41. A polysilicon cell plate layer 42 is then blanket deposited over the array surface. Now that capacitor formation is complete, the array may be completed in a conventional manner.

Although only a single embodiment of the enhance-capacitance DRAM array is disclosed herein, it will be evident to those having ordinary skill in the art of semiconductor fabrication that changes and modifications may be made thereto without departing from the scope and spirit of the invention as claimed.

We claim:
1. A capacitor for a dynamic random access memory cell . comprising:
   a) a storage node plate having a silicon-germanium alloy layer as its charge storing surface;
   b) a cell plate layer; and
   c) a dielectric layer which is interposed between the silicon-germanium alloy layer and the cell plate layer, said dielectric layer possessing the property of bulk-limited conduction.

2. The capacitor of claim 1, wherein said silicon-germanium alloy layer has a rough surface morphology characterized by macroscopic islanding of alloy crystals.

3. The capacitor of claim 2, wherein the average diameter of the islands which are responsible for the rough morphology of the alloy layer surface is at least four times the thickness of the dielectric layer.

4. The capacitor of claim 3, wherein the average diameter of the islands, which are responsible for the rough morphology of the alloy layer surface, ranges between 200–2000Å.

5. The capacitor of claim 3, wherein said dielectric layer comprises silicon nitride.

6. The capacitor of claim 5, wherein said dielectric layer further comprises silicon dioxide.

7. The capacitor of claim 6, wherein said dielectric layer comprises at least one silicon nitride layer and at least one silicon dioxide layer.

8. The capacitor of claim 7, wherein said dielectric layer comprises tantalum pentoxide.

9. The capacitor of claim 8, wherein said dielectric layer comprises tantalum pentoxide and silicon nitride.

10. The capacitor of claim 9 wherein said silicon layer of which the storage-node plate is comprised is a single-crystal silicon substrate.

11. The capacitor of claim 10, wherein said silicon layer of which the storage-node plate is comprised is polycrystalline silicon.

12. The capacitor of claim 11, wherein said cell plate layer comprises conductively-doped polycrystalline silicon.

13. A capacitor for a dynamic random access memory cell comprising:
   a) a storage node plate consisting of a conductively-doped silicon layer, the upper surface of which is coated with a polycrystalline silicon-germanium alloy layer;
   b) a cell plate layer; and
   c) a dielectric layer which is interposed between the silicon-germanium alloy layer and the cell plate layer, said dielectric layer possessing the property of bulk-limited conduction.

14. The capacitor of claim 13, wherein said silicon-germanium alloy layer has a rough surface morphology characterized by macroscopic islanding of alloy crystals.

15. The capacitor of claim 14, wherein the average diameter of the islands which are responsible for the rough morphology of the alloy layer surface is at least four times the thickness of the dielectric layer.

16. The capacitor of claim 15, wherein said dielectric layer comprises silicon nitride.

17. The capacitor of claim 16, wherein said dielectric layer further comprises silicon dioxide.

18. The capacitor of claim 17, wherein said dielectric layer comprises at least one silicon nitride layer and at least one silicon dioxide layer.

19. The capacitor of claim 18, wherein said dielectric layer comprises tantalum pentoxide.

20. The capacitor of claim 19, wherein said dielectric layer comprises tantalum pentoxide and silicon nitride.

21. The capacitor of claim 20, wherein said silicon layer of which the storage-node plate is comprised is a single-crystal silicon substrate.

22. The capacitor of claim 21, wherein said silicon layer of which the storage-node plate is comprised is polycrystalline silicon.

23. The capacitor of claim 22, wherein said cell plate layer comprises conductively-doped polycrystalline silicon.

24. The capacitor of claim 14, wherein the average diameter of the islands, which are responsible for the rough morphology of the alloy layer surface, ranges between 200–2000Å.

* * * * *